United States Patent
Gwon et al.

(10) Patent No.: US 10,193,499 B2
(45) Date of Patent: Jan. 29, 2019

(54) MULTIPHASE POWER SUPPLY HAVING SINGLE COMPARATOR

(71) Applicants: SAMSUNG ELECTRO-MECHANICS CO., LTD., Suwon-si (KR); Korea Advanced Institute of Science and Technology, Daejeon (KR)

(72) Inventors: Hui Dong Gwon, Daejeon (KR); Gyu Hyeong Cho, Daejeon (KR); Jeong Hoon Kim, Suwon-si (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 214 days.

(21) Appl. No.: 15/401,628

(22) Filed: Jan. 9, 2017

(65) Prior Publication Data

US 2017/0353160 A1 Dec. 7, 2017

(30) Foreign Application Priority Data

Jun. 2, 2016 (KR) .................. 10-2016-0068537

(51) Int. Cl.
| | |
|---|---|
| *H03F 1/02* | (2006.01) |
| *H03F 3/189* | (2006.01) |
| *H03F 3/20* | (2006.01) |
| *H03K 3/017* | (2006.01) |

(Continued)

(52) U.S. Cl.
CPC ............. *H03F 1/02* (2013.01); *H03F 1/0227* (2013.01); *H03F 3/189* (2013.01); *H03F 3/19* (2013.01);

(Continued)

(58) Field of Classification Search
CPC ........................................................ H03F 1/02
See application file for complete search history.

(56) References Cited

U.S. PATENT DOCUMENTS

| | | | | |
|---|---|---|---|---|
| 5,959,441 A | * | 9/1999 | Brown ............... | H02M 3/1584 307/82 |
| 7,876,080 B2 | * | 1/2011 | Dwarakanath ......... | H02M 1/36 323/284 |

(Continued)

FOREIGN PATENT DOCUMENTS

| | | |
|---|---|---|
| CN | 103636119 A | 3/2014 |
| JP | 2013-198148 A | 9/2013 |

(Continued)

*Primary Examiner* — Patricia T Nguyen
(74) *Attorney, Agent, or Firm* — NSIP Law

(57) ABSTRACT

A multiphase power supply includes a multiphase converter including first and second converters having differing operating phases, each of the first and second converters configured to convert input power into driving power, and transmit the driving power to a power amplifier, a detector configured to detect a voltage based on the driving power, and a duty controller configured to compare an error voltage between an envelope signal of an input signal input into the power amplifier and the detected voltage and sawtooth wave signals having different phases from each other to generate duty control signals, wherein the duty controller compares the error voltage and the sawtooth wave signals with each other using a single comparator.

17 Claims, 7 Drawing Sheets

(51) Int. Cl.
*H03F 3/19* (2006.01)
*H03F 3/24* (2006.01)
*H03K 4/08* (2006.01)

(52) U.S. Cl.
CPC .............. *H03F 3/20* (2013.01); *H03F 3/245* (2013.01); *H03K 3/017* (2013.01); *H03F 2200/102* (2013.01); *H03F 2200/471* (2013.01); *H03K 4/08* (2013.01)

(56) References Cited

U.S. PATENT DOCUMENTS

| | | | |
|---|---|---|---|
| 8,120,205 B2* | 2/2012 | Heineman | G06F 1/26 307/52 |
| 2005/0212498 A1* | 9/2005 | Kubota | H02M 3/156 323/282 |
| 2009/0121695 A1* | 5/2009 | Pierson | H02M 3/1584 323/283 |
| 2010/0085024 A1* | 4/2010 | Houston | H02M 3/1584 323/281 |
| 2013/0015830 A1* | 1/2013 | Zhang | H02M 1/14 323/282 |
| 2013/0222062 A1 | 8/2013 | Park et al. | |
| 2015/0002232 A1 | 1/2015 | Tsuji | |
| 2016/0211750 A1* | 7/2016 | Coleman | H02M 1/15 |
| 2017/0019133 A1 | 1/2017 | Gwon et al. | |

FOREIGN PATENT DOCUMENTS

| | | |
|---|---|---|
| KR | 10-2008-0087583 A | 10/2008 |
| KR | 10-2013-0097502 A | 9/2013 |
| KR | 10-2017-0008933 A | 1/2017 |

* cited by examiner

MULTIPHASE POWER SUPPLY HAVING SINGLE COMPARATOR

CROSS-REFERENCE TO RELATED APPLICATIONS

This application claims the benefit under 35 USC 119(a) of Korean Patent Application No. 10-2016-0068537 filed on Jun. 2, 2016 in the Korean Intellectual Property Office, the entire disclosure of which is incorporated herein by reference for all purposes.

BACKGROUND

1. Field

The following description relates to a multiphase power supply used in a power supply of a power amplifier (PA) and having a duty control structure using a single comparator.

2. Description of Related Art

Recently, technology capable of transmitting a large amount of information and lowering power consumption has been demanded in wireless communications systems. Therefore, wireless communications systems have been required to have wide band characteristics and a high peak to average power ratio (PAPR).

In order to increase a usable lifetime of a battery and improve energy efficiency, an envelope tracking power supply (ETPS) capable of changing power usage of a linear amplifier based on a change in a magnitude of a radio frequency (RF) signal has been developed.

Recently, in accordance with the development of a design approach, a rapid operational speed and high efficiency may be accomplished by using only a switching ETPS structure. Therefore, a design for a high efficiency switching amplifier has been required instead of a linear amplifier.

Additionally, a structure capable of having a high effective switching frequency and increasing a bandwidth in order to improve efficiency and follow a rapid input envelope by removing a linear amplifier of which efficiency is low and using only a switching amplifier has been suggested.

When a converter having a three-level multiphase structure is used, an effective switching frequency increases, such that a structure capable of reducing a ripple voltage as well as following a rapid input envelope signal without using the linear amplifier may be implemented in a system that should have a wide bandwidth, such as a long term evolution (LTE) 20 MHz system.

However, the converter having the three-level multiphase structure as described above does not include a separate circuit for correcting an error in an output once again, such as the linear amplifier or a high frequency buck regulator. As a result, in such a converter, it is difficult to accurately balance currents between phases of a multiphase operation.

In addition, when a current mismatch between the phases is generated, a ripple of an output voltage increases. In one example, a negative current flows, such that efficiency also deteriorates.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multiphase power supply includes a multiphase converter including first and second converters having differing operating phases, each of the first and second converters configured to convert input power into driving power based on a corresponding duty control signal of duty control signals and transmit the driving power to a power amplifier, a detector configured to detect a voltage based on the driving power, and a duty controller configured to compare an error voltage between an envelope signal of an input signal input into the power amplifier and the detected voltage and sawtooth wave signals having different phases from each other to generate the control signals, wherein the duty controller compares the error voltage and the sawtooth wave signals with each other using a single comparator.

The multiphase power supply may further include a sawtooth wave generator configured to generate first to fourth sawtooth wave signals having different phases.

The duty controller may include an error amplifier configured to provide the error voltage using a difference between the envelope signal and the detected voltage, a multiplexer configured to sequentially select a sawtooth wave signal of the sawtooth wave signals, the single comparator configured to compare the sawtooth wave signal of the sawtooth wave signals and the error voltage with each other to sequentially generate each of the duty control signals, a demultiplexer configured to sequentially select the duty control signals from the single comparator individually and provide the selected duty control signals to different output terminals, and a latch unit configured to latch each of the duty control signals from the demultiplexer and provide each of the latched duty control signals to the multiphase converter.

The duty controller may further include a phase controller configured to control operations of the multiplexer and the demultiplexer based on an output signal of the single comparator.

The latch unit may include latches configured to latch the duty control signals from the demultiplexer, respectively.

The multiphase converter may be a three-level multiphase converter.

The single comparator may receive the error voltage through an inverting input terminal of the single comparator.

A first switch, connected between the inverting input terminal of the single comparator and a terminal of a reference voltage, may be in a switched-on state in a calibration mode, and may be in a switched-off state in an operation mode after the calibration mode ends.

A second switch, connected between the inverting input terminal of the single comparator and an output terminal of the error amplifier, may be in a switched-off state in a calibration mode, and may be in a switched-on state in an operation mode after the calibration mode ends.

In another general aspect, a multiphase power supply includes a multiphase converter including first and second converters having differing operating phases, each of the first and second converters configured to convert input power into driving power based on a corresponding duty control signal of duty control signals and transmit the driving power to a power amplifier, a detector configured to detect a voltage based on the driving power, a duty controller configured to compare an error voltage between an envelope signal of an input signal input into the power amplifier and the detected voltage and sawtooth wave signals having different phases from each other to generate the duty control signals, and a sawtooth wave generator configured to generate sawtooth wave signals having different phases, wherein the duty controller compares the error voltage and the sawtooth wave signals with each other using a single comparator, and the sawtooth wave generator calibrates other sawtooth wave signals based on a sawtooth wave signal of the sawtooth wave signals.

The duty controller may include an error amplifier configured to provide the error voltage using a difference between the envelope signal and the detected voltage, a multiplexer configured to sequentially select a sawtooth wave signal of the sawtooth wave signals, the single comparator configured to compare the sawtooth wave signal of the sawtooth wave signals and the error voltage with each other to sequentially generate each of the duty control signals, a demultiplexer configured to sequentially select the duty control signals from the single comparator individually and provide the selected duty control signals to different output terminals, and a latch unit configured to latch each of the duty control signals from the demultiplexer and provide each of the latched duty control signals to the multiphase converter.

The duty controller may further include a phase controller configured to control operations of the multiplexer and the demultiplexer based on an output signal of the single comparator.

The latch unit may include latches configured to latch the duty control signals from the demultiplexer, respectively.

The sawtooth wave generator may calibrate the sawtooth wave signals using a duty integrated value for each of the sawtooth wave signals in a calibration mode before an operation mode.

The multiphase converter may be a three-level multiphase converter.

The sawtooth wave generator may be further configured to generate the sawtooth wave signals by comparing a preset reference voltage and each of the sawtooth wave signals with each other to provide a duty signal for each of the sawtooth wave signals, integrate the duty signal for each of the sawtooth wave signals to provide a corresponding duty integrated value, compare the duty integrated value for a first sawtooth wave signal in the sawtooth wave signals and the duty integrated value for each of the remaining sawtooth wave signals in the sawtooth wave signals with each other, and calibrate the remaining sawtooth wave signals based on a comparison result between the duty integrated values.

In another general aspect, a method of calibrating sawtooth wave signals for a comparator includes generating the sawtooth wave signals by comparing a preset reference voltage and each of the sawtooth wave signals with each other to provide a duty signal for each of the sawtooth wave signals, integrating the duty signal for each of the sawtooth wave signals to produce a corresponding duty integrated value, comparing the duty integrated value for a first sawtooth wave signal in the sawtooth wave signals and the duty integrated value for each of the remaining sawtooth wave signals in the sawtooth wave signals with each other, and calibrating the remaining sawtooth wave signals based on a comparison result between the duty integrated values.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
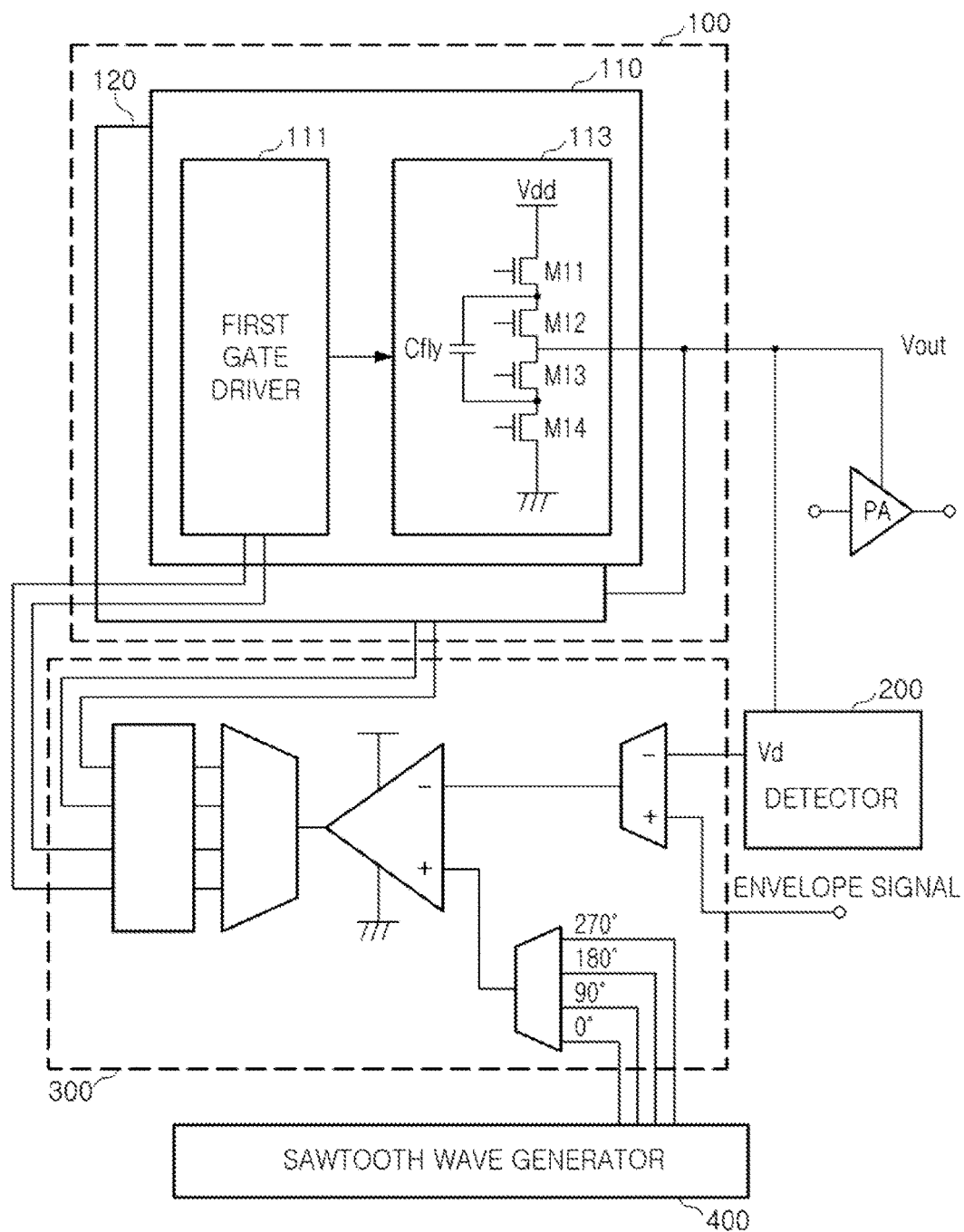
FIG. 1 is a block diagram of a multiphase power supply according to an example.

FIG. 1 is a block diagram of a multiphase power supply according to an example.

Referring to FIG. 1, the multiphase power supply according to the example includes a multiphase converter 100, a detector 200, and a duty controller 300.

In addition, in the example of FIG. 1, the multiphase power supply further includes a sawtooth wave generator 400. However, this is only an example, and other examples operate without the sawtooth wave generator 400.

For example, the multiphase converter 100 includes first and second converters 110 and 120 having operating phases that are different from each other. Each of the first and second converters 110 and 120 converts input power Vdd into driving power Vout of a power amplifier PA based on a corresponding duty control signal of a plurality of duty control signals.

As an example, the multiphase converter 100 includes the first and second converters 110 and 120 of which the operating phases are different from each other. In this example, the first converter 110 and the second converter 120 convert the input power Vdd into the driving power Vout of the power amplifier PA based on the corresponding duty control signals.

The detector 200 detects a voltage based on the driving power Vout transferred from the multiphase converter 100 to the power amplifier PA, and provides the detected voltage Vd.

As an example, the detector 200 includes at least two resistors. The detector 200 detects the voltage associated with the driving power Vout at an intermediate node between the two resistors, and provides the detected voltage Vd. As a result, the detector 200 facilitates gathering of information that helps manage phase deviation.

The duty controller 300 sequentially compares an error voltage Verr between an envelope signal of an input signal input to the power amplifier PA and the detected voltage Vd and a plurality of sawtooth wave signals having different phases from each other. Based on such a comparison, the duty controller 300 generates the plurality of duty control signals, and provides the generated duty control signals to the multiphase converter 100. In such a manner, it is possible to utilize these signals together to manage phase mismatches.

As an example, the duty controller 300 sequentially compares the plurality of sawtooth wave signals with the error voltage Verr using a single comparator, and generates the plurality of duty control signals depending on an obtained comparison result. By using a single comparator, the duty controller 300 minimizes the complexity and cost of examples.

The sawtooth wave generator 400 generates the plurality of sawtooth wave signals having different phases. As discussed, the sawtooth wave signals are used as reference signals for the power supply.

As an example, the sawtooth wave generator 400 calibrates additional sawtooth wave signals based on a sawtooth wave signal of the plurality of sawtooth wave signals.

Referring to the example of FIG. 1, the multiphase converter 100 may be a three-level multiphase converter. In an example in which the multiphase converter 100 is a three-level two-phase converter, the multiphase converter 100 includes the first converter 110 and the second converter 120, as described above.

The first converter 110 includes a first gate driver 111 and a first three-level switching circuit 113. However, other configurations of the first converter 110 are possible.

Accordingly, the first gate driver 111 generates a gate driving signal based on a corresponding duty control signal from the duty controller 300.

In the example of FIG. 1, the first three-level switching circuit 113 includes first to fourth switches M11 to M14 connected to one another in series between a providing terminal of input power Vdd and a ground. The first to fourth switches M11 to M14 may be operated based on the gate driving signal to provide three-level driving power Vout.

In addition, the second converter 120 is operated by similar configurations and principles as those of the first converter 110, and a detailed description thereof is replaced by the description of the first converter 110, as the description of the first and converters 110 and 120 are the same.

For reference, a more detailed description of the three-level switching circuit described above is provided in Korean Patent Laid-Open Publication No. 10-2015-0100009, and is thus omitted for brevity. However, this reference only discusses aspects of one possible circuit structure and should not be taken as limiting.

Figure 2:
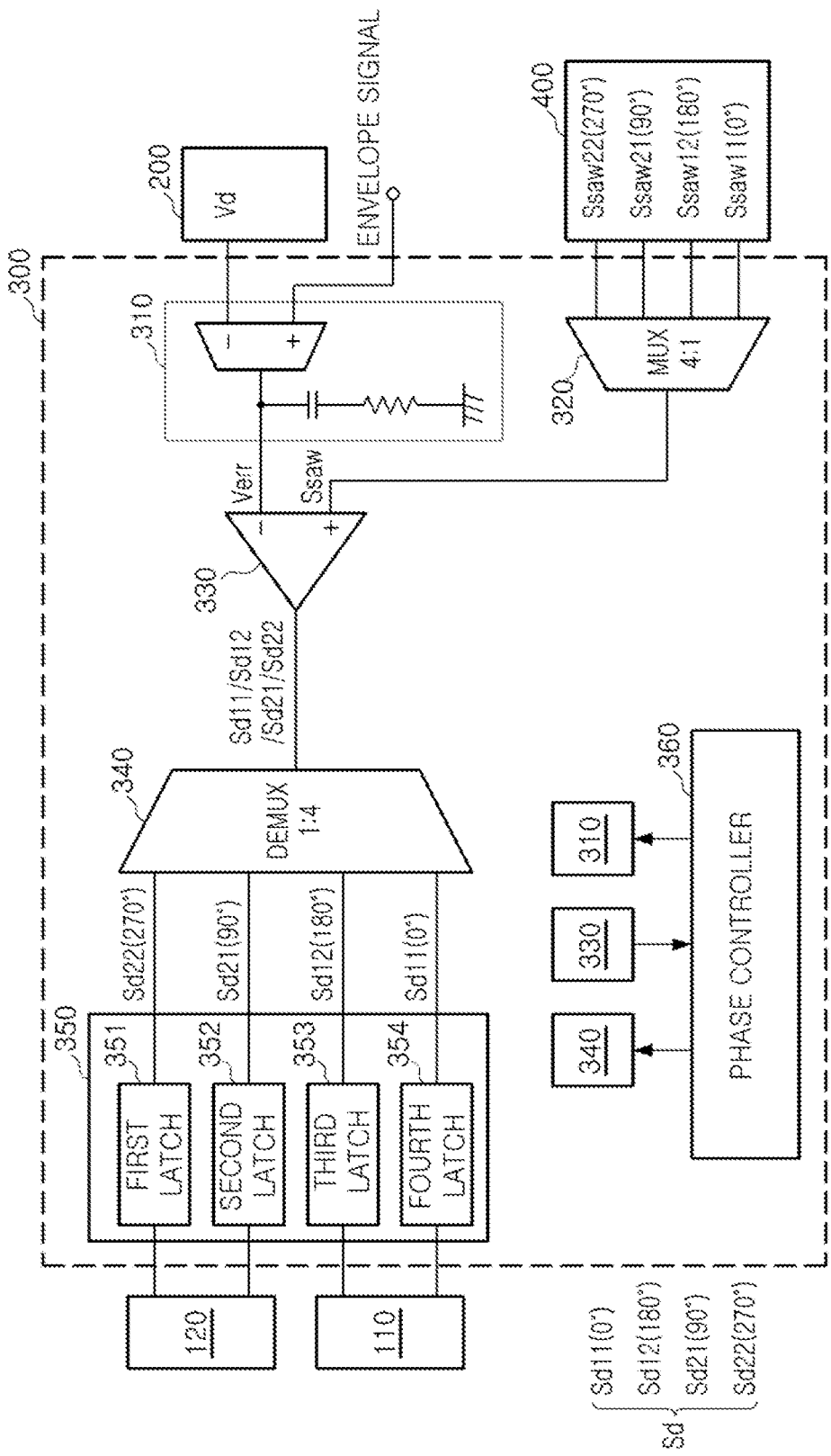
FIG. 2 is a block diagram of a duty controller according to an example.

FIG. 2 is a block diagram of a duty controller according to an example.

Referring to the example of FIG. 2, the duty controller 300 includes an error amplifier 310, a multiplexer (MUX) 320, a single comparator 330, a demultiplexer (DEMUX) 340, and a latch unit 350.

In addition, in the example of FIG. 2, the duty controller 300 further includes a phase controller 360. However, this is only one example and other duty controllers 300 operate without a phase controller 360.

The error amplifier 310 provides the error voltage Verr using a difference between the envelope signal and the detected voltage Vd.

For example, the error amplifier 310 includes a voltage stabilizing circuit having a voltage stabilizing element such as a capacitor, or a similar voltage stabilizing element, disposed at an output terminal of the error amplifier 310 in order to stabilize an output voltage. Therefore, the error amplifier 310 provides a voltage from which a ripple has been removed by the voltage stabilizing circuit. By removing the ripple, the error amplifier 310 improves the reliability and performance of the overall duty controller 300.

The multiplexer 320 sequentially selects a sawtooth wave signal of the plurality of sawtooth wave signals.

As an example, in an example in which the sawtooth wave generator 400 generates first to fourth sawtooth wave signals Ssaw11, Ssaw12, Ssaw21, and Ssaw22, the multiplexer 320 sequentially selects the first sawtooth wave signal Ssaw11, the second sawtooth wave signal Ssaw12, the third sawtooth wave signal Ssaw21, and the fourth sawtooth wave signal Ssaw22 individually, and sequentially provides the selected sawtooth wave signals to the single comparator 330 individually.

The single comparator 330 compares the plurality of sawtooth wave signals sequentially selected by the multiplexer 320 with the error voltage Verr individually to sequentially generate each of the plurality of duty control signals.

As an additional example, in the example in which the sawtooth wave generator 400 generates the first to fourth sawtooth wave signals Ssaw11, Ssaw12, Ssaw21, and Ssaw22, the single comparator 330 compares the first sawtooth wave signal Ssaw11 and the error voltage Verr with each other to generate a first duty control signal Sd11, compares the second sawtooth wave signal Ssaw12 and the error voltage Verr with each other to generate a second duty control signal Sd12, compares the third sawtooth wave signal Ssaw21 and the error voltage Verr with each other to generate a third duty control signal Sd21, and compares the fourth sawtooth wave signal Ssaw22 and the error voltage Verr with each other to generate a fourth duty control signal Sd22.

The demultiplexer 340 sequentially selects the plurality of duty control signals sequentially input from the single comparator 330 individually, and provides the selected duty control signals to different output terminals.

As described above, the plurality of sawtooth wave signals having the multiphase structure and the error voltage Verr are sequentially processed using the multiplexer 320, the single comparator 330, and the demultiplexer 340. Therefore, a mismatch between multiple phases generated in an example in which a plurality of comparators are included is reduced by processing the signals in a way that progressively reduces phase mismatching.

The latch unit 350 latches each of the plurality of duty control signals from the demultiplexer 340 and provides each of the latched duty control signals to the multiphase converter 100 to allow it to operate with improved performance.

As an example, in the example in which the sawtooth wave generator 400 generates the first to fourth sawtooth wave signals Ssaw11, Ssaw12, Ssaw21, and Ssaw22, the latch unit 350 includes first to fourth latches 351 to 354. In this example, the first to fourth latches 351 to 354 latch the first to fourth duty control signals Sd11, Sd12, Sd21, and Sd22 from the demultiplexer 340, respectively, and provide the latched duty control signals Sd11, Sd12, Sd21, and Sd22 to the multiphase converter 100, respectively.

In addition, in the example of FIG. 2, the phase controller 360 controls operations of the multiplexer 320 and the demultiplexer 340 on the basis of an output signal of the single comparator 330.

As an example, the phase controller 360 synchronizes the operations of the multiplexer 320 and the demultiplexer 340 with each other on the basis of an output signal of the single comparator 330. For example, the phase controller 360 controls selection operations of the multiplexer 320 and the demultiplexer 340 at a point in time at which the output signal of the single comparator 330 is output. By performing such synchronizing, the overall functioning of the duty controller 300 is facilitated.

Referring to the examples of FIGS. 1 and 2, the sawtooth wave generator 400 generates the first to fourth sawtooth wave signals Ssaw11, Ssaw12, Ssaw21, and Ssaw22 having different phases (0°, 180°, 90°, and 270°). These phases provide an even division of phases into four sawtooth wave signals.

In this example, the latch unit 350 includes the first to fourth latches 351 to 354. The first to fourth latches 351 to 354 latch the first to fourth duty control signals Sd11, Sd12, Sd21, and Sd22 from the demultiplexer 340, respectively.

Although four phases are illustrated in the drawings, this is only an example number of phases, and the number of phases is not limited thereto. In a different number of phases, the sawtooth wave signals may correspond to different angular phase values.

Figure 3:
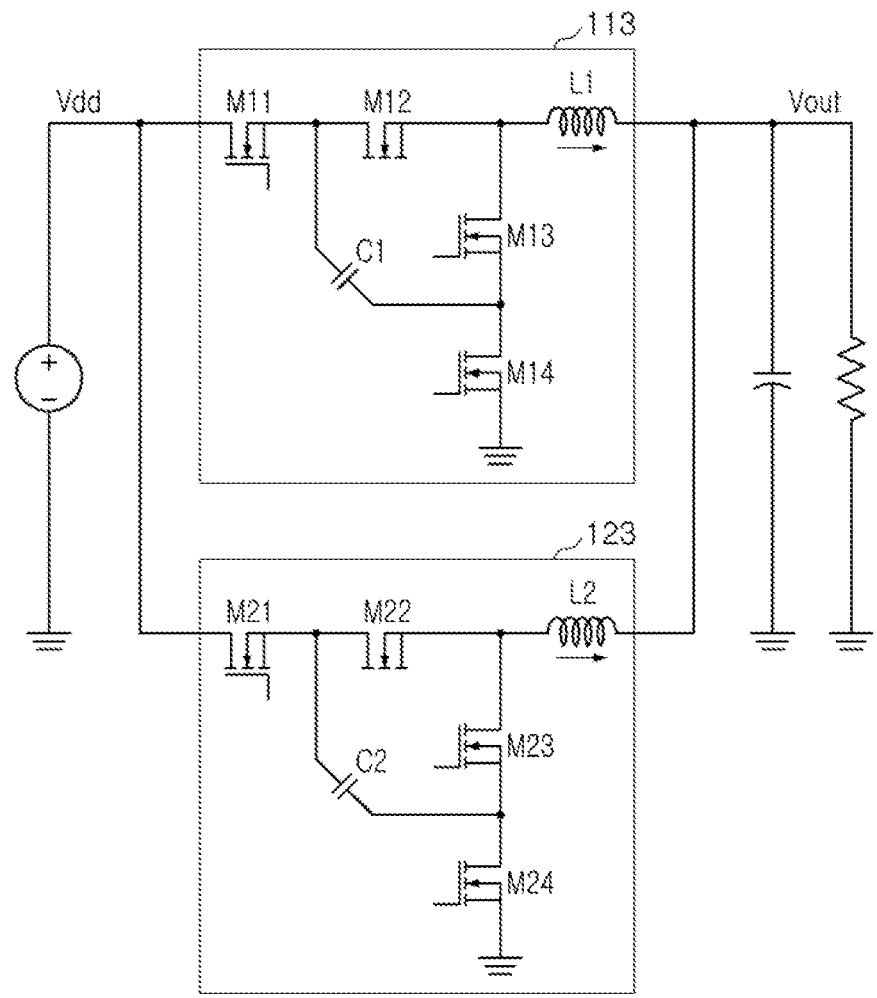
FIG. 3 is an equivalent circuit diagram of a multiphase converter according to an example.

FIG. 3 is an equivalent circuit diagram of a multiphase converter according to an example.

Referring to the example of FIG. 3, the first converter 110 includes the first three-level switching circuit 113, and the second converter 120 includes a second three-level switching circuit 123.

In this example, the first three-level switching circuit 113 and the second three-level switching circuit 123 are connected to each other in parallel, as illustrated in FIG. 3.

The first three-level switching circuit 113 includes first to fourth switches M11 to M14 connected to one another in series between a providing terminal of input power Vdd and a ground. In this example, each of the first to fourth switches M11 to M14 may be a metal oxide semiconductor (MOS) transistor. Also, a first capacitor C1 is connected between a connection node between the first and second switches M11 and M12 and a connection node between the third and fourth switches M13 and M14. Furthermore, a first inductor L1 is connected between a connection node between the second and third switches M12 and M13 and an output node. However, this is only an example switching circuit, and different circuit structures are possible in other examples.

In the example of FIG. 3, the first to fourth switches M11 to M14 are operated based on the gate driving signal to provide three-level driving power Vout.

In addition, the second three-level switching circuit 123 includes fifth to eighth switches M21 to M24 connected to one another in series between a providing terminal of input power Vdd and a ground. In this example, each of the fifth to eighth switches M21 to M24 may be an MOS transistor.

Also, a second capacitor C2 is connected between a connection node between the fifth and sixth switches M21 and M22 and a connection node between the seventh and eighth switches M23 and M24. Furthermore, a second inductor L2 is connected between a connection node between the sixth and seventh switches M22 and M23 and an output node. However, this is only an example switching circuit, and different circuit structures are possible in other examples.

In the example of FIG. 3, the fifth to eighth switches M21 to M24 are operated based on the gate driving signal to provide three-level driving power Vout.

Figure 4:
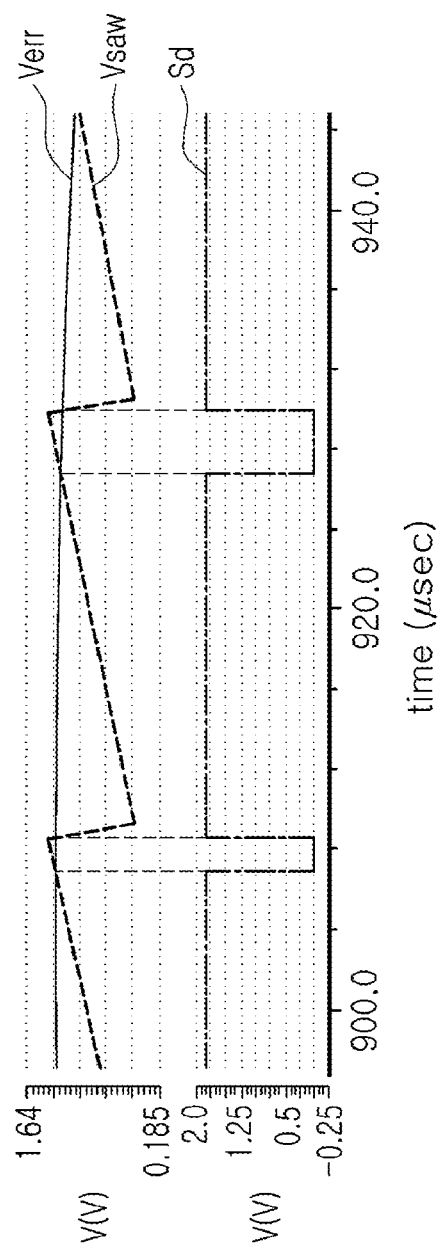
FIG. 4 is a single-phase signal chart illustrating an operation of a single comparator according to an example.

FIG. 4 is a single-phase signal chart illustrating an operation of a single comparator according to an example.

Referring to the examples of FIGS. 2 and 4, the single comparator 330 receives a sawtooth wave signal selected by the multiplexer 320 through a non-inverting input terminal of the single comparator 330 and receives the error voltage Verr through an inverting input terminal of the single comparator 330, and compares a voltage of the sawtooth wave signal and the error voltage Verr with each other to generate a duty control signal.

As an example, the duty control signal Sd has an on-duty level, which is a high level, when the voltage Vsaw of the sawtooth wave signal Ssaw is higher than the error voltage Verr. The duty control signal Sd also has an off-duty level, which is a low level, when the voltage Vsaw of the sawtooth wave signal Ssaw is lower than the error voltage Verr.

Figure 5:
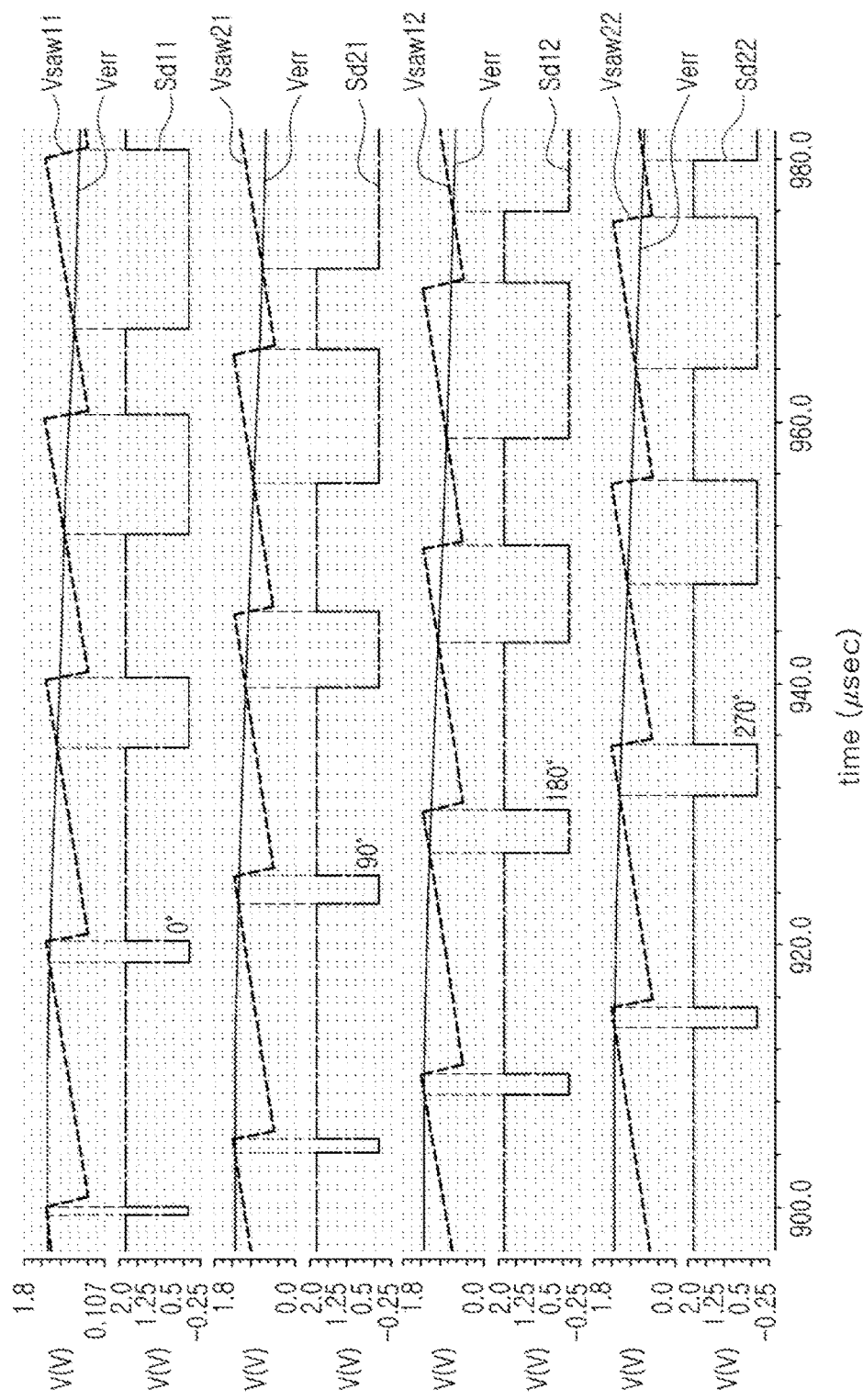
FIG. 5 is a multiphase signal chart illustrating an operation of a single comparator according to an example.

FIG. 5 is a multiphase signal chart illustrating an operation of a single comparator according to an example.

Referring to the examples of FIGS. 2 and 5, in the example in which the sawtooth wave generator 400 generates the first to fourth sawtooth wave signals Ssaw11, Ssaw12, Ssaw21, and Ssaw22, the single comparator 330 sequentially receives one sawtooth wave signal selected by the multiplexer 320 among the first to fourth sawtooth wave signals Ssaw11, Ssaw12, Ssaw21, and Ssaw22 through a non-inverting input terminal of the single comparator 330 and receives the error voltage Verr through an inverting input terminal the single comparator 330. The single comparator 330 also compares one of voltages Vsaw11, Vsaw12, Vsaw21, and Vsaw22 of the first to fourth sawtooth wave signals Ssaw11, Ssaw12, Ssaw21, and Ssaw22 and the error voltage Verr with each other to generate the first to fourth duty control signals Sd11, Sd12, Sd21, and Sd22. Thus, such operation and comparison of the single comparator 330 facilitates the duty control process.

In the example of FIG. 5, a phase of each of the first to fourth duty control signals Sd11, Sd12, Sd21, and Sd22 is synchronized with a phase of each of the first to fourth sawtooth wave signals Ssaw11, Ssaw12, Ssaw21, and Ssaw22.

Figure 6:
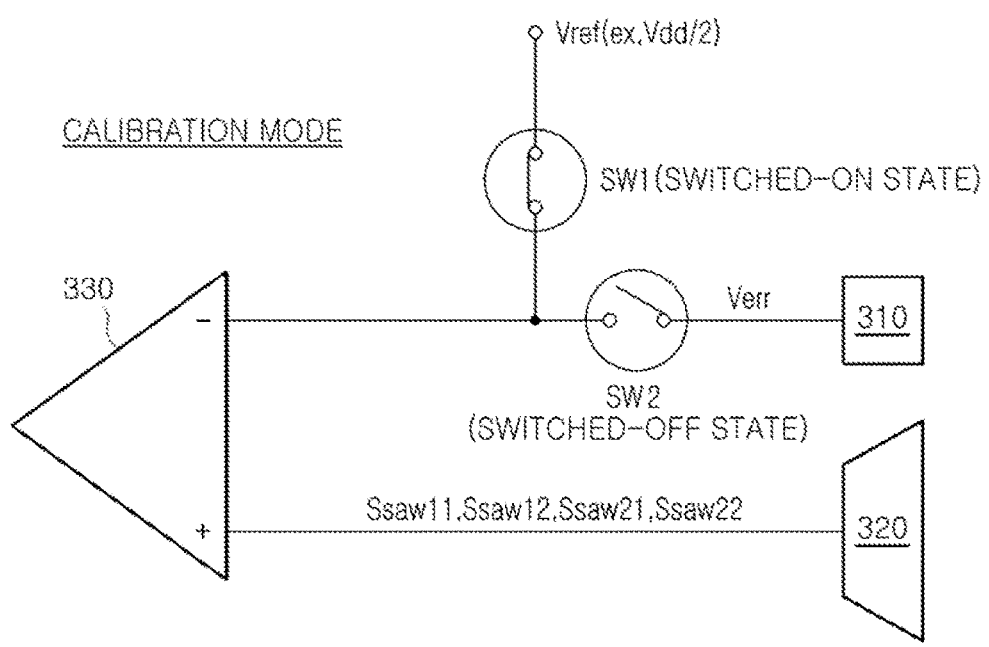
FIG. 6 is a view illustrating mode switching for performing a calibration process of a sawtooth wave signal according to an example.

FIG. 6 is a view illustrating mode switching for performing a calibration process of a sawtooth wave signal according to an example.

Referring to the example of FIG. 6, the multiphase power supply according to the example includes a first switch SW1 and a second switch SW2 for selecting an operation mode.

In the example of FIG. 6, the first switch SW1 is connected between the inverting input terminal of the single comparator 330 and a terminal of a reference voltage Vref. The first switch SW1 is maintained in a switched-on state in a calibration mode, and is maintained in a switched-off state in an operation mode after the calibration mode ends. For example, the reference voltage Vref is provided using the input power Vdd, and may be, for example, Vdd/2. However, other reference values are possible in other examples.

The second switch SW2 is connected between the inverting input terminal of the single comparator 330 and an output terminal of the error amplifier 310. The second switch SW2 is maintained in a switched-off state in the calibration mode, and is maintained in a switched-on state in the operation mode after the calibration mode ends.

Therefore, in the calibration mode, the first switch SW1 is in the switched-on state and the second switch SW2 is in the switched-off state, such that the reference voltage is provided to the inverting input terminal of the single comparator 330 through the first switch SW1.

By contrast, in the operation mode after the calibration mode, the first switch SW1 is in the switched-off state and the second switch SW2 is in the switched-on state, such that the error voltage is provided to the inverting input terminal of the single comparator 330 through the second switch SW2.

Figure 7:
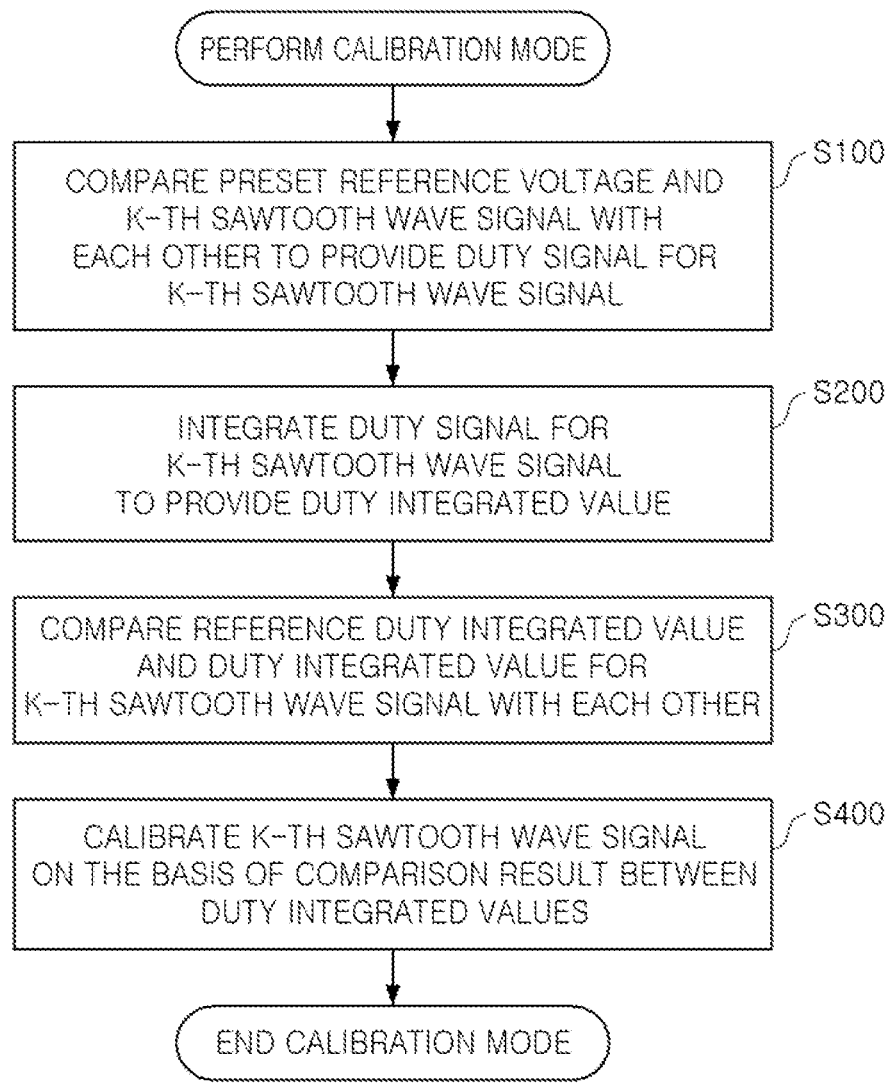
FIG. 7 is a flow chart of a calibration mode of a sawtooth wave signal according to an example.

FIG. 7 is a flow chart of a calibration mode of a sawtooth wave signal according to an example.

Referring to FIGS. 1 through 7, the sawtooth wave generator 400 generates the plurality of sawtooth wave signals including the first to fourth sawtooth wave signals Ssaw11, Ssaw12, Ssaw21, and Ssaw22, and performs the calibration mode before the operation mode at the time of power-up by performing operation S100 to compare the preset reference voltage Vref and each of the first to fourth sawtooth wave signals with each other, thereby providing the duty signal for each of the first to fourth sawtooth wave signals.

Then, the sawtooth wave generator 400 performs operation S200 by integrating the duty signal for each of the first to fourth sawtooth wave signals Ssaw11, Ssaw12, Ssaw21, and Ssaw22 to provide each duty integrated value.

Then, the sawtooth wave generator 400 performs operation S300 by comparing the duty integrated value for the first sawtooth wave signal Ssaw11 and the duty integrated value for each of the second to fourth sawtooth wave signals Ssaw12, Ssaw21, and Ssaw22 with each other.

Then, the sawtooth wave generator 400 performs operation S400 by calibrating the second to fourth sawtooth wave signals Ssaw12, Ssaw21, and Ssaw22 on the basis of a comparison result between the duty integrated values.

An offset such as a direct current (DC) offset, a gradient offset, or another similar type of offset, between the plurality of sawtooth wave signals may be compensated for by the calibration as described above.

As described above, according to the example, the single comparator may be used to reduce a mismatch between the respective phases of the multiphase, and the sawtooth wave signals may be calibrated in the calibration mode before the operation mode to prevent a voltage ripple from becoming large and prevent a negative current from being generated.

As set forth above, according to the example, the multiphase power supply having a single comparator is used in a power supply of a power amplifier (PA), reduces a mismatch between phases of a multiphase, prevents a voltage ripple from becoming large, and prevents a negative current from being generated.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multiphase power supply, comprising:
a multiphase converter comprising first and second converters having differing operating phases, each of the first and second converters configured to convert input power into driving power based on a corresponding duty control signal of duty control signals and transmit the driving power to a power amplifier;
a detector configured to detect a voltage based on the driving power; and
a duty controller configured to compare an error voltage between an envelope signal of an input signal input into the power amplifier and the detected voltage and sawtooth wave signals having different phases from each other to generate the duty control signals,
wherein the duty controller compares the error voltage and the sawtooth wave signals with each other using a single comparator.

2. The multiphase power supply of claim 1, further comprising:
a sawtooth wave generator configured to generate first to fourth sawtooth wave signals having different phases.

3. The multiphase power supply of claim 1, wherein the duty controller comprises:
an error amplifier configured to provide the error voltage using a difference between the envelope signal and the detected voltage;
a multiplexer configured to sequentially select a sawtooth wave signal of the sawtooth wave signals;
the single comparator configured to compare the sawtooth wave signal of the sawtooth wave signals and the error voltage with each other to sequentially generate each of the duty control signals;
a demultiplexer configured to sequentially select the duty control signals from the single comparator individually and provide the selected duty control signals to different output terminals; and
a latch unit configured to latch each of the duty control signals from the demultiplexer and provide each of the latched duty control signals to the multiphase converter.

4. The multiphase power supply of claim 3, wherein the duty controller further comprises a phase controller configured to control operations of the multiplexer and the demultiplexer based on an output signal of the single comparator.

5. The multiphase power supply of claim 3, wherein the latch unit comprises latches configured to latch the duty control signals from the demultiplexer, respectively.

6. The multiphase power supply of claim 3, wherein the multiphase converter is a three-level multiphase converter.

7. The multiphase power supply of claim 1, wherein the single comparator receives the error voltage through an inverting input terminal of the single comparator.

8. The multiphase power supply of claim 7, wherein a first switch, connected between the inverting input terminal of the single comparator and a terminal of a reference voltage, is in a switched-on state in a calibration mode, and is in a switched-off state in an operation mode after the calibration mode ends.

9. The multiphase power supply of claim 7, wherein a second switch, connected between the inverting input terminal of the single comparator and an output terminal of the error amplifier, is in a switched-off state in a calibration mode, and is in a switched-on state in an operation mode after the calibration mode ends.

10. A multiphase power supply, comprising:
a multiphase converter comprising first and second converters having differing operating phases, each of the first and second converters configured to convert input power into driving power based on a corresponding duty control signal of duty control signals and transmit the driving power to a power amplifier;
a detector configured to detect a voltage based on the driving power;
a duty controller configured to compare an error voltage between an envelope signal of an input signal input into the power amplifier and the detected voltage and sawtooth wave signals having different phases from each other to generate the duty control signals; and
a sawtooth wave generator configured to generate sawtooth wave signals having different phases,
wherein the duty controller compares the error voltage and the sawtooth wave signals with each other using a single comparator, and
the sawtooth wave generator calibrates other sawtooth wave signals based on a sawtooth wave signal of the sawtooth wave signals.

11. The multiphase power supply of claim 10, wherein the duty controller comprises:
an error amplifier configured to provide the error voltage using a difference between the envelope signal and the detected voltage;
a multiplexer configured to sequentially select a sawtooth wave signal of the sawtooth wave signals;
the single comparator configured to compare the sawtooth wave signal of the sawtooth wave signals and the error voltage with each other to sequentially generate each of the duty control signals;
a demultiplexer configured to sequentially select the duty control signals from the single comparator individually and provide the selected duty control signals to different output terminals; and
a latch unit configured to latch each of the duty control signals from the demultiplexer and provide each of the latched duty control signals to the multiphase converter.

12. The multiphase power supply of claim 11, wherein the duty controller further comprises a phase controller configured to control operations of the multiplexer and the demultiplexer based on an output signal of the single comparator.

13. The multiphase power supply of claim 11, wherein the latch unit comprises latches configured to latch the duty control signals from the demultiplexer, respectively.

14. The multiphase power supply of claim 10, wherein the sawtooth wave generator calibrates the sawtooth wave signals using a duty integrated value for each of the sawtooth wave signals in a calibration mode before an operation mode.

15. The multiphase power supply of claim 10, wherein the multiphase converter is a three-level multiphase converter.

16. The multiphase power supply of claim 10, wherein the sawtooth wave generator is further configured to:
generate the sawtooth wave signals by comparing a preset reference voltage and each of the sawtooth wave signals with each other to provide a duty signal for each of the sawtooth wave signals;
integrate the duty signal for each of the sawtooth wave signals to provide a corresponding duty integrated value;
compare the duty integrated value for a first sawtooth wave signal in the sawtooth wave signals and the duty integrated value for each of the remaining sawtooth wave signals in the sawtooth wave signals with each other; and
calibrate the remaining sawtooth wave signals based on a comparison result between the duty integrated values.

17. A method of calibrating sawtooth wave signals for a comparator, comprising:
generating the sawtooth wave signals by comparing a preset reference voltage and each of the sawtooth wave signals with each other to provide a duty signal for each of the sawtooth wave signals;
integrating the duty signal for each of the sawtooth wave signals to produce a corresponding duty integrated value;
comparing the duty integrated value for a first sawtooth wave signal in the sawtooth wave signals and the duty integrated value for each of remaining sawtooth wave signals in the sawtooth wave signals with each other; and
calibrating the remaining sawtooth wave signals based on a comparison result between the duty integrated values.

* * * * *